United States Patent [19]

Fudim et al.

[11] Patent Number: 4,960,674
[45] Date of Patent: Oct. 2, 1990

[54] METHOD OF FABRICATING FLUIDIC PLATES AND DEVICES BY IRRADIATION OF PHOTOPOLYMERS

[75] Inventors: Efrem V. Fudim, Whitefish Bay; Jeannine O. Colla, Mequon, both of Wis.

[73] Assignee: Johnson Service Company, Milwaukee, Wis.

[21] Appl. No.: 682,090

[22] Filed: Dec. 17, 1984

[51] Int. Cl.⁵ .......................................... G03C 1/725
[52] U.S. Cl. .................................. 430/284; 430/320; 430/324; 430/327; 430/394
[58] Field of Search ............... 430/284, 320, 324, 327, 430/394

[56] References Cited

U.S. PATENT DOCUMENTS

| | | | |
|---|---|---|---|
| 4,137,081 | 1/1979 | Pohl | 96/87 R |
| 4,174,218 | 11/1979 | Pohl | 430/306 |
| 4,207,914 | 6/1980 | Holloway et al. | 137/85 |
| 4,228,232 | 10/1980 | Rousseau | 430/271 |
| 4,317,559 | 3/1982 | Finkbeiner et al. | 251/331 |
| 4,447,292 | 5/1984 | Schuster-Woldan et al. | 156/644 |

OTHER PUBLICATIONS

Floidies, Glenn et al., High Technology, Aug. 1983, p. 71.
Cabot Corp., Aqueous Dispersion of Cab—O—Sil New Technique Aging Stability Thixotropic Epoxies.
Cabot Corp., Viscosity Stability at Elevated Temps with CAB—O—Sil.

*Primary Examiner*—Patrick Ryan
*Attorney, Agent, or Firm*—Edward L. Levine; Larry L. Shupe

[57] ABSTRACT

In general and in one preferred method, a diaphragm plate may be formed by providing a vessel containing a quantity of a light-transmittive first photopolymer compound which includes, as mixed constituents, a reactive oligomer resin, a reactive monomer diluent and a photoinitiator. A first unmasked surface of the compound is irradiated with ultraviolet (UV) light for solidifying the surface to a depth equal to the relief thickness, i.e., the desired diaphragm thickness. A second surface of the compound is irradiated with UV light subsequent to being covered with a opaque mask which defines the shape of the diaphragm. This irradiation completes the formation of the diaphragm plate by solidifying the remaining, unmasked quantity of compound. The unsolidified compound is then removed from the masked area of the plate. Other preferred methods are also disclosed.

13 Claims, 3 Drawing Sheets

METHOD OF FABRICATING FLUIDIC PLATES AND DEVICES BY IRRADIATION OF PHOTOPOLYMERS

This invention relates to the fabrication of structures by irradiating photopolymers. More particularly, it relates to such a method for pneumatic device plates, substantially unsupported structures useful as control elements in otherwise conventional fluidic devices. The method also relates to the fabrication of free-standing fluidic control devices which incorporate diaphragm plates having certain movable control portions which cooperate with, for example, more rigid interface plates embodying nozzles, control orifices and the like.

The fabrication of certain structures using photopolymers has long been known. For example, U.S. Pat. Nos. 4,137,081; 4,174,218 and 4,228,232, and other patents cited therein contain certain teachings relative to the fabrication of printing plates using disclosed polymers. That it is possible to fabricate certain types of fluidic elements and circuits using photopolymer material is suggested in a publication entitled "Fluidics" which was published by Fluid Amplifier Associates of Ann Arbor, Mich., the available portion of which is attached hereto as Appendix I. The publication is believed to have been made in the 1960's. However, the structures described and illustrated therein as well as printing plates fabricated using the teachings of the aforementioned Patents use, as a starting material, a sheetlike substance frequently disposed upon rigid support materials. Further, an article in HIGH TECHNOLOGY magazine, issue of August 1983, includes certain teachings regarding the use of lasers to form photopolymers and a copy of that article is attached hereto as Appendix II.

While the aforementioned Patents and articles are reasonably definitive of methods useful for fabricating fully relief plates as, for example, printing plates from a sheet material which is sensitive to ultraviolet (UV) light, they have failed to provide solutions to the fabrication of substantially unsupported pneumatic device plates such as interface plates and diaphragm plates which are useful alone or in conjunction with one another in the art of fluidic control devices. While the methods described herein are broadly useful in the construction of liquid and gaseous fluidic devices, they will be described in the field of pneumatics as being exemplary.

Pneumatic control devices frequently include, as a component thereof, a thin, resilient and highly flexible diaphragm which serves at least two functions. The diaphragm may prevent the flow of air between two adjacent chambers and/or may act as a flow controlling device for preventing, metering or permitting full flow of air into or out of a rigid control nozzle by movably reacting to minute changes in differential pressure across the diaphragm. An example of an apparatus which uses such a diaphragm is shown and described in U.S. Pat. No. 4,207,914. These functional requirements dictate that the diaphragm be highly resilient, have a smooth surface for nozzle closure and have sufficient strength to withstand pressures typically encountered in the pneumatic control system to which they are applied. For example, in known heating, ventilating and air conditioning (HVAC) pneumatic control systems, pressures of 20-25 psig are usually encountered. Conventional diaphragms are fabricated of rubber, neoprene or Buna N in flat sheet form or are molded to include ribs and peripheral sealing shoulders. The use of diaphragms of this type is frequently attended by the use of multiple clamping screws and reinforcing plates to help maintain air-tight integrity and by the use of adhesives which often undesirably tend to flow to unwanted areas, thereby impairing the performance quality of the finished structure.

Diaphragms of the conventional type are frequently mounted adjacent interface plates which include, for example, control orifices having diameters on the order of a few thousandths of an inch and control nozzles, the ported tips of which interact with the diaphragm surface. Unlike the diaphragms, these interface plates must be relatively rigid and capable of being molded or otherwise fabricated to close dimensional tolerances and with smooth surfaces including smooth orifice passages. Prior to the method of the instant invention, conventionally fabricated pneumatic control devices were characterized by the inclusion of support plates, covers, gasket rings, clamping clips and assembly screws required to form the complete apparatus. A method of fabricating a diaphragm plate, an interface plate and a free-standing fluidic control device, all by irradiating photopolymers and which results in a dramatic reduction in required time and in the number of parts comprising an assembly and therefore, in manufactured costs would be a distinct advance in the arts.

SUMMARY OF THE INVENTION

In general and in one preferred method, a diaphragm plate may be formed by providing a vessel containing a quantity of a light-transmittive first photopolymer compound which includes, as mixed constituents, a reactive oligomer resin, a reactive monomer diluent and a photoinitiator. A first unmasked surface of the compound is irradiated with ultraviolet (UV) light for solidifying the surface to a depth equal to the relief thickness, i.e., the desired diaphragm thickness. A second surface of the compound is irradiated with UV light subsequent to being covered with a opaque mask which defines the shape of the diaphragm. This irradiation completes the formation of the diaphragm plate by solidifying the remaining, unmasked quantity of compound. The unsolidified compound is then removed from the masked area of the plate.

In another preferred method, irradiation of the first, unmasked surface may be omitted and the second surface is irradiated subsequent to being covered with a mask having areas of different opacities, the configuration and the opacity of each area being selected to define, for example, a flow channel, a diaphragm or a control passage when the second surface is uniformly irradiated with collimated UV light.

In yet another preferred method, a vessel is provided which contains a quantity of a light transmittive first photopolymer compound for forming the diaphragm portion of a diaphragm plate. The quantity of the first compound is selected to provide a first depth equal to the desired thickness of the diaphragm portion. After solidifying the first compound by irradiation with UV light, a quantity of a second compound is cast atop the first compound with the combined depths of the first and second compounds being equal to the desired thickness of the diaphragm plate. A surface of the second compound is partially covered by an opaque mask defining a diaphragm shape and irradiation of the second compound will form the diaphragm plate by solidifying the unmasked quantity of the second compound, thereby bonding it to the first compound.

A free-standing fluidic control device may be fabricated by using at least one diaphragm plate and by further providing a plurality of vessels, each containing a quantity of a light-transmittive second photopolymer compound for forming an interface plate. Each quantity has a first surface which is partially covered by an opaque mask defining at least one control channel and at least one control nozzle. These first surfaces are irradiated with UV light to solidify the unmasked quantities of the second compound, thereby forming a plurality of interface plates. The unsolidified compound is then removed from the masked areas of the plates and the plates are bonded one to another to form a free-standing pneumatic control device.

It is an object of the present invention to provide a method for fabricating pneumatic device plates such as a diaphragm plate using photopolymers.

Yet another object of the present invention is to provide a method for fabricating relatively rigid interface plates using photopolymers.

Still another object of the present invention is to provide a method for fabricating diaphragm and interface plates which may be bonded to one another by irradiation to form a free-standing pneumatic control device.

Yet another object of the present invention is to provide a method for fabricating diaphragm and interface plates by the use of masks having areas of the same or different opacities.

Still another object of the present invention is to provide a method for fabricating diaphragm and interface plates by the use of diffuse or collimated ultraviolet light.

Another object of the present invention is to provide a method for fabricating such plates which may have substantial thickness, on the order of up to one-half inch. How these and other objects will be accomplished will become more apparent from the detailed description thereof taken in conjunction with the accompanying drawing.

DETAILED DESCRIPTION OF THE PREFERRED METHODS

Figure 1:
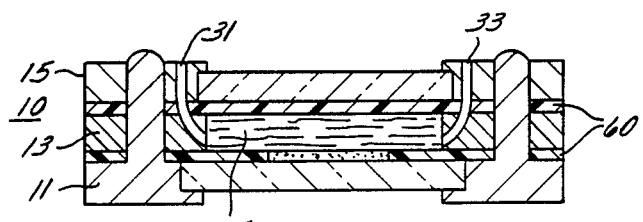
FIG. 1 is a side elevation view in cross section of a vessel useful for carrying out a method of the invention.
Figure 2:
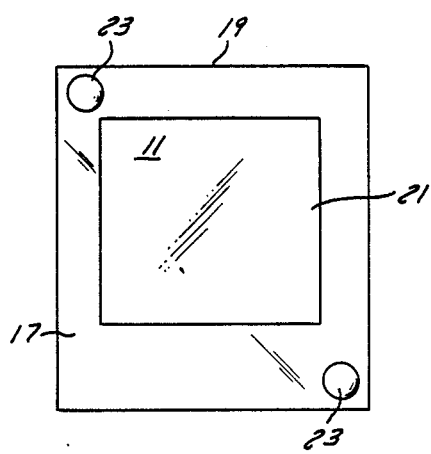
FIG. 2 is a top plan view of a lower plate used in the vessel of FIG. 1.

To form a perimeter-supportable diaphragm plate which has a movable diaphragm, it is preferable to use a vessel, a mask and a first compound to be irradiated and one preferred vessel 10 will be first described. Referring to FIGS. 1 through 5 inclusive, and especially to FIG. 1, a suitable vessel 10 may be formed by using, in the order of assembly from bottom to top, a lower plate 11, a spacer plate 13, and a top plate 15. Referring particularly to FIG. 2, the rigid lower plate 11 has a top surface 17 and a bottom surface parallel thereto and includes a perimeter portion 19 which may be conveniently formed of metal to surround and secure a central window 21, preferably formed of quartz, soda lime glass or other rigid material transmittive of UV light. For optimum quality of the diaphragm plate to be formed, the plate 11 and the window 21 will have co-planar surfaces. The plate 11 also includes a plurality of upwardly vertically projecting, cylindrical locating dowels 23 for vertically aligning the plates 11, 13, 15 and masks during assembly. The spacer plate 13 of FIG. 4 has a thickness determinative of the thickness of the diaphragm or interface plate to be fabricated and is likewise preferably rigidly made of metal, has parallel top and bottom surfaces and has formed therein a central aperture 25 having a shape and location generally coincident with that of the window 21. The plate 13 further includes a plurality of dowel holes 27 sized and located to receive the dowels 23 with closely-fitted, sliding fit. The locations of the dowels 23 and dowel holes 27 are selected to vertically align the window 21 and the aperture 25. The spacer plate 13 includes, on its upper surface, a pair of runner channels 29, one each in fluid flow communication with a fill port 31 and with an overflow port 33. The fill port 31 and its related channel 29 may be used for flowing photopolymer into the vessel cavity 35 as described below while the runner channel 29 and its related port 33 will permit displaced air to be expelled from the cavity 35. The volume of fluid contained within the ports 31, 33 and channels 29 will provide makeup fluid required because of slight shrinkage of the volume of photopolymer contained within the cavity 35.

Figure 5:
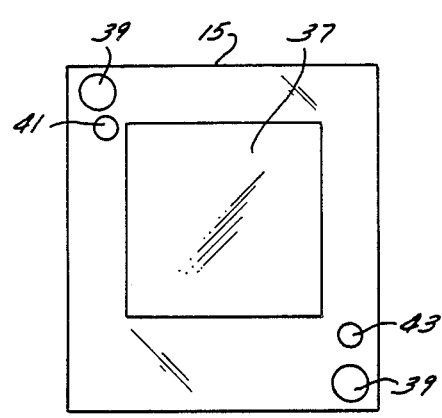
FIG. 5 is a top plan view of a top plate useful in the vessel of FIG. 1.

Referring further to FIG. 5, the top plate 15 with its incorporated window 37 is closely similar in configuration to the bottom plate 11 except that in place of the locating dowels 23, the top plate includes holes 39 for receiving those dowels 23 with close, sliding fit. The top plate 15 also includes a pair of holes, 41 and 43 to be in registry with the ports 31 and 33 respectively when the top plate 15 is in position. All plates 11, 13, 15 include a plurality of through holes (not shown) arranged to be in registry one with another when the plates 11, 13, 15 and mask(s) are assembled, the holes being sized to receive clamping bolts therethrough for maintaining the structural and air-tight integrity of the vessel 10 while the vessel cavity 35 is being filled and while the photopolymer is being cured.

Figure 6:
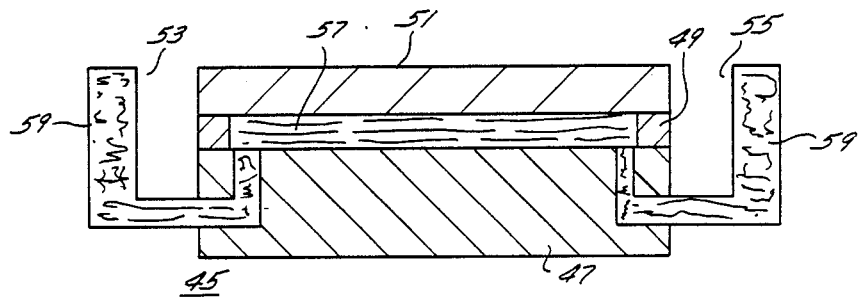
FIG. 6 is a side elevation view in cross-section of another vessel useful in carrying out a method of the invention.

Referring next to FIG. 6, another preferred vessel 45 may be formed using a lower plate 47, a spacer plate 49 and a top plate 51. Those plate surfaces which are horizontally disposed in FIG. 6 are preferably formed to be parallel, smooth and flat in order to achieve the highest quality of the diaphragm plate or interface plate to be fabricated. The lower plate 47 is preferably made of Teflon for easy vessel disassembly since it has been found that with the UV light energy levels employed in the invention, that portion of the photopolymer which is within a few thousandths of an inch of the lower plate 47 will remain soft, permitting easy disassembly. The top plate 51 may be formed of soda-lime glass, with or without an image-bearing photoemulsion coating. If a top plate 51 is employed which has no such coating, a mask may be employed and placed atop the top plate 51. However, it has been found that when the image is disposed between the spacer plate 49 and the top plate 51, either in the form of a coating upon the underside of the top plate 51 or in the form of a separate mask sheet, the quality of the photopolymer product formed by the method is improved.

The bottom plate 47 also includes a fill spigot 53 and an overflow spigot 55 formed therein, each spigot 53, 55 having its internal end in fluid flow communication with the cavity 57 defined by the bottom plate 47, the spacer 49 and the top plate 51. Each spigot 53, 55 includes a neck portion 59, the vertical height of which is selected so that the upper terminus is disposed above the upper surface of the photopolymer product to be formed. The bottom plate 47, spacer 49, top plate 51 and any mask(s) 60 used therewith may be held in relative position one to the other by a suitably configured clamping fixture (not shown). Clamping and unclamping will be facilitated if the fixture is of a type having a piston powered movable platen operated by compressed air. Liquid photopolymer may be placed into the cavity 57 by pressure injection through the fill spigot 53 or by submersing the terminus of the fill spigot 53 in the polymer and drawing a slight vacuum at the overflow spigot 55. In either event, the necks 59 of the spigots 53, 55 should be filled with photopolymer so that fluid makeup caused by slight shrinkage may be effected.

With modifications, the vessel 45 of FIG. 6 may be used to carry out a method for forming a diaphragm plate and is constructed to include a first spacer 49 which has a thickness equal to the desired thickness of the diaphragm portion of such a plate, typically on the order of 5 mils. After filling the cavity 57 defined by the bottom plate 47, the first spacer plate 49 and the top plate 51 with a first compound, that quantity of compound is solidified by irradiation with UV light. Thereafter, the first spacer plate 49 is removed and a second spacer plate (not shown) is substituted therefor, the second spacer plate having a thickness equal to the desired thickness of the diaphragm plate, i.e., greater than the thickness of the diaphragm portion alone. It will be observed that upon separation of the plate 49 from plate 51, the solidified first compound will adhere to the underside of the latter. A quantity of a second compound is then cast within the second spacer plate, i.e., beneath the solidified first compound, to a second depth, the first depth and the second depth, combined, being equal to the thickness of the second spacer plate, i.e., the desired thickness of the completed diaphragm plate. As described below, the top surface of the second compound is then partially covered by an opaque mask which defines the desired diaphragm shape and location The assembly is again irradiated with ultraviolet light until solidification of the unmasked portion occurs, thereby forming the complete diaphragm plate. It will be apparent from the foregoing that substitution of the first spacer plate 49 with a second spacer plate may be avoided simply by providing a second spacer plate which has a thickness equal to the desired depth of the second compound. In that instance, the two spacer plates would be used together when casting and solidifying the quantity of second compound. It will also be appreciated that the diaphragm plate so formed will have two layers tightly bonded one to another, the first incorporating the resilient diaphragm portion itself and the second, harder layer defining the diaphragm support structure.

Masks which may be useful in fabricating a diaphragm plate and a free-standing fluidic control device will now be described and it is to be appreciated that the masks described below represent only a few of the thousands of mask configurations which might be employed. They are exemplary and the configuration of any mask which may be used with the inventive method is limited only by the parameters of the application and the imagination of the user after appreciating the teachings of the disclosure.

Figure 3:
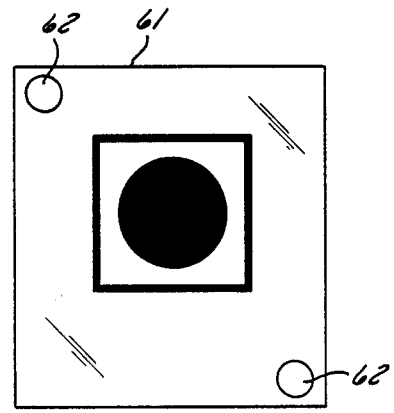
FIG. 3 is a top plan view of an exemplary mask useful in a method of the invention.
Figure 4:
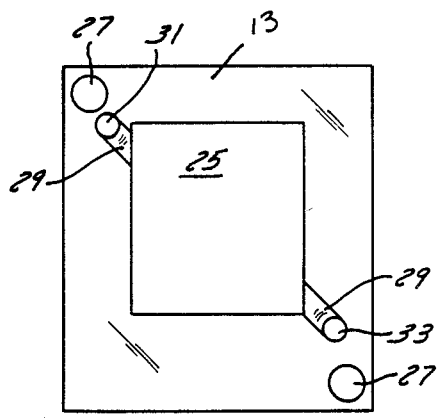
FIG. 4 is a top plan view of a spacer plate useful in the vessel of FIG. 1.
Figure 7:
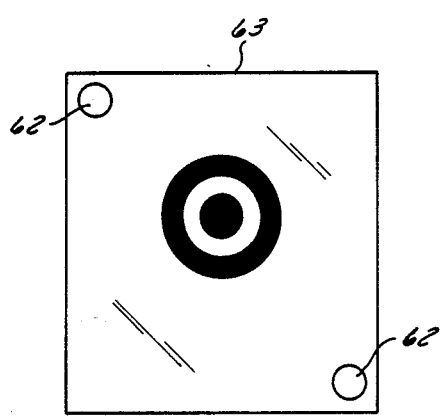
FIG. 7 is a top plan view of another exemplary mask useful in carrying out a method of the invention.
Figure 9:
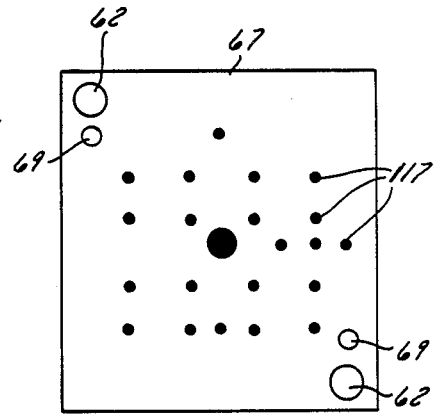
FIG. 9 is a top plan view of a top mask useful in fabricating an interface plate according to a method of the invention.
Figure 8:
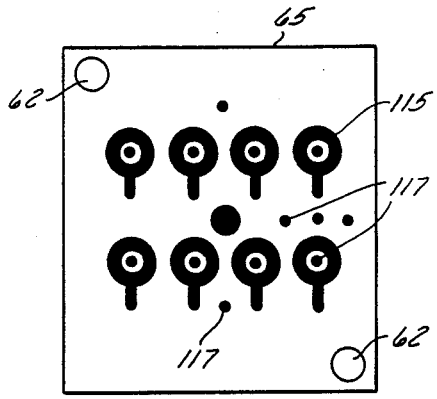
FIG. 8 is a top plan view of a bottom mask useful in fabricating an interface plate according to a method of the invention.

Masks may be formed using a clear, sheet material as, for example, cellulose acetate and will have a preferred thickness of between 4 mils and 7 mils. The material should be capable of transmitting UV light therethrough without significant attenuation and should be chemically inert to such light to avoid discoloration or clouding which would otherwise impair light transmission. Two mask materials which have been found particularly useful are available from Eastman Kodak Company under their trademark Estar, film materials LPD 7 and LPF 7, both of which are of 7 mil thickness. A mask including an opaque negative portion is applied, the opaque portion to have a size and shape corresponding with those areas of the volume of fluid photopolymer where it is desired to prohibit curing by preventing UV light from striking the fluid. All mask(s) to be used with the vessel 10 of FIG. 1, e.g. mask(s) 60, will preferably have dowel receiving holes 62 and bolt throughholes to permit aligned incorporation of the mask into the completed assembly. An example of a mask 61 useful in the fabrication of a simple diaphragm is shown in FIG. 3 while an example of a second mask 63 useful for fabricating a compound, reinforced diaphragm is illustrated in FIG. 7. FIGS. 8 and 9 illustrate, respectively, a bottom mask 65 and a top mask 67 useful for fabricating an interface plate which includes a plurality of control nozzles and orifices. The manner of using these masks 65, 67 will be set forth in greater detail following and it is to be noted that any mask used as a top mask, e.g. mask 67, is to have holes 69 therethrough which are in registry with holes 41 and 43 and with the ports 31 and 33 to permit the free flow of the liquid photopolymer into and out of the vessel cavity 35.

Figure 10:
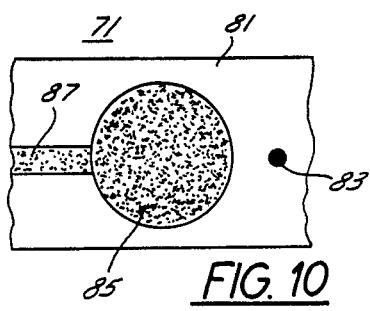
FIG. 10 is a top plan view of a mask useful in forming an interface plate according to a method of the invention.
Figure 11:
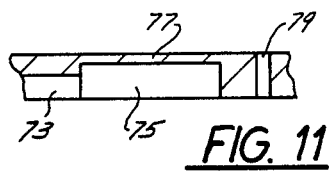
FIG. 11 is a cross-sectional side elevation view of an interface plate formed using the mask of FIG. 10.

FIG. 10 illustrates another type of mask 71 which may be used to form diaphragm plates or interface plates. It is to be appreciated that the illustrated mask 71 is merely by way of example and that the number and configuration of masks which may be employed after appreciating the teachings of the disclosure is very large. When employing a mask 71 of the type shown in FIG. 10, it is contemplated that the photopolymer product may be formed by irradiating only one surface thereof, i.e., that surface in contact with or closest to the mask 71. The use of a mask 71 of the type of FIG. 10 contemplates that the entirety of the volume of compound confined within a vessel cavity 35 or 57 will be irradiated with UV light of the same intensity and for the same time duration. In the exemplary FIG. 10 and as best seen in FIG. 11, the depth of the pneumatic flow passage 73, the depth of the area 75 below the flexible diaphragm 77 and the presence and site of a through passage 79 will be controlled by the location and relative opacity of each area configured upon the mask 71. More specifically, the translucent mask material 81 will have a first area 83 of a first exemplary opacity of 100% which may be used for defining an orifice, a second circular area 85 of a second exemplary opacity of 90% for defining the diaphragm 77 and a third area 87 of an exemplary third opacity of 50% for defining the flow passage 73.

The methods of the invention contemplate the use of a first compound for fabricating a simple diaphragm plate or the use of first and/or second compounds for fabricating a complex diaphragm plate or for fabricating an interface plate. A suitable first compound is available from Hercules Incorporated of Wilmington, Del. as its formulation FF090. While the precise formulation of this compound is not available from the manufacturer, it is a liquid which crosslinks in a chain reaction to form a relatively insoluble solid upon exposure to UV light. This reaction may terminate when cross linking of the compound becomes fully complete or when the cross linked material becomes opaque and thereby inhibits further linking.

It is believed that the FF090 compound probably has a close similarity to a chemical compound such as one containing a reactive oligomer resin having the following formula, a prepared polymer:

$$CH_2=CH-\overset{O}{\overset{\|}{C}}-O-CH_2-\overset{OH}{\overset{|}{CH}}-CH_2-O-R^1 \ldots$$

$$[R^1-O-\overset{O}{\overset{\|}{C}}-\overset{H}{\overset{|}{N}}-R-\overset{H}{\overset{|}{N}}-\overset{O}{\overset{\|}{C}}-O-R^1] \ldots$$

$$R^1-O-CH_2-\overset{}{\underset{OH}{CH}}-CH_2O-\overset{O}{\overset{\|}{C}}-CH=CH_2$$

a reactive monomer diluent having either the formula

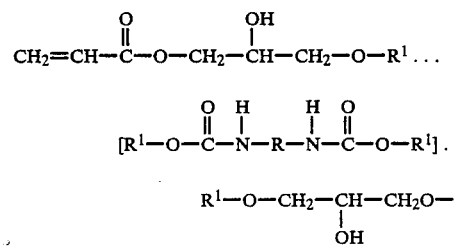 (1,6 Hexanediol Methacrylate)

or the formula

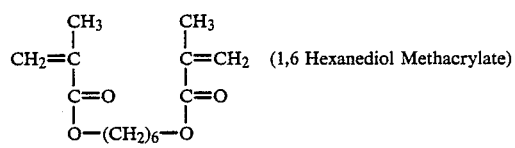 (Lauryl Methacrylate)

or possibly both and a photoinitiator having a formula

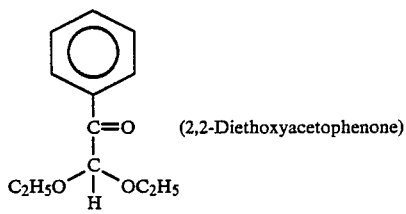 (2,2-Diethoxyacetophenone)

It is possible that the FF090 compound also contains an inhibitor which prevents cross-linking when exposed to ambient temperature and light conditions.

Those characteristics of the first compound which make it desirable in the inventive method include a viscosity of about 50,000 cps in order that the compound be readily flowable into the vessel cavity 35 or 57. It should be capable of transmitting UV radiation in compound thicknesses of up to approximately one-half inch since thicknesses of this order may be used in the formation of free standing fluidic devices. The wavelength of UV light of which the compound should be transmittive has a range of 300–400 nm and a range of 350–380 nm is preferred for making plates and devices. As an example of a first compound having acceptable transmittance, the FF090 material in a sample of 0.080″ thickness, transmitted the following power levels of UV light to an underlying radiometer: 1.1 mw per sq. cm. upon initial exposure, 0.81 mw per sq. cm. after 1 minute, 0.5 mw per sq. cm. after 2 minutes, 0.4 mw per sq. cm. after 3 minutes, 0.33 mw per sq. cm. after 4 minutes and negligible amounts after 5 minutes. The exposure unit light source used for this test is described in detail below.

Additionally, a preferred first compound should be insensitive to and retain its fluid characteristic at room ambient temperatures and lighting levels. It should have low toxicity to be readily disposable when liquid, non-cured compound is removed from the plates and should also be able to provide sharp images when used with masks having opaque portions as prior described. That is, it should have negligible UV light self-propagating characteristics and substantially no tendency for cured portions to promote curing of adjacent material. A suitable first compound should also have a low shrinkage rate, at least less than about 5% and preferably about 1% or less. Further, the compound should be of the thermoset type, i.e., it will not soften upon exposure to elevated temperatures as may be encountered in the application of the finished plate or device. It should also be resistent to those chemicals including oils as may be encountered in the application. As an example, plates and devices used in an HVAC system should be impervious to compressor lubricating oil, some small quantity of which is almost invariably entrained in the pneumatic fluid. It should also maintain its resilience at those temperatures encountered in the application and in an HVAC system, such temperatures may approach the freezing point of water. A first compound useful for the construction of diaphragm plates which include a resilient, movable diaphragm such as diaphragm 77 as a control element portion thereof will preferably have a cured-state tensile strength in the range of 3500/4500 psi, elongation in the range of 55/70%, a Young's modulus in the range of 10,000/11,000 psi and a hardness in the range of 92/95 Shore A. It should be further capable of resulting in a diaphragm which is able to undergo a fatigue test of about one million cycles at a peak pressure to be encountered in the system, nominally 20-25 psig in an HVAC system. Another substance useful as a first compound is formula 2296 of Beacon Chemical Co. It is believed to be generally similar in chemical composition to the first compound described above.

When fabricating a compound diaphragm plate or an interface plate which includes control orifices and/or control nozzles, it is preferred that such plates have greater rigidity than diaphragm plates. Accordingly, a second compound is preferably used for fabrication of plates of the interface type. The second compound is preferably a liquid in the non-irradiated state which solidifies by cross-linking upon exposure to UV light. A preferred second compound has, as mixed constituents, a first constituent of the first compound, a second constituent of a resin having a polyester base, at least two urethane groups, at least two methacrylate monomers and a photoinitiator. A suitable second constituent photopolymer compound is available from Northwest Chemical Co. under its formulation no. 5534. A third constituent of the second compound is preferably similar to the first compound but is formulated with a lower percentage of oligomer resin and higher percentages of the monomer diluent and the photoinitiator. This third constituent is available from Hercules Inc. under its formulation no. FF090-3. The fourth constituent of the second compound comprises a light transmittive, fumed pyrogenic silica and a satisfactory fourth constituent is available from Cabot Corporation of Boston, Mass. under its trade name Cab-O-Sil, M grade. Photocopies of three brochures describing Cab-O-Sil pyrogenic silica are attached hereto as Appendices III, IV and V.

A preferred, fully cured second compound will have a tensile strength in the range of 2800/3300 psi, an elongation in the range of 10-14% and a Young's modulus in the range of 210,000/248,000 psi. The preferred second compound includes 20% to 40% of the first constituent, 60% to 80% of the second constituent, 0.25% to 5.0% of the third constituent and 0.25% to 5.0% of the fourth constituent, all percentages by weight. Within the stated ranges, a preferred second compound will have 24%, 75%, 0.5% and 0.5% of the first through fourth constituents respectively.

The preferred methods of using the aforedescribed vessels 10 or 45, masks and compounds to fabricate diaphragm plates and interface plates will now be described. Referring to FIGS. 1-5 and if it is desired to fabricate a simple diaphragm plate, the bottom plate 11, bottom mask 61, spacer plate 13, top mask 60 and top plate 15 will be assembled in that order from bottom to top as generally shown in FIG. 1. A clear top mask 60 having no negative (opaque portion) thereon is interposed between the spacer plate 13 and the top plate 15 for providing a smooth, fluid sealing surface. After assembly of the vessel 10 and installation of the retentive throughbolts, the first compound may be hypodermically injected into the cavity 35 using the port 31 and associated runner channel 29 for the purpose. Injection continues until the level of the compound is flush with the top of the overflow port 33. In order to permit the quantity of fluid within the fill port 31, overflow port 33 and channels 29 to make up for shrinkage, the ports 31, 33 are then masked with small pieces of opaque tape for preventing the passage of UV light therethrough.

To perform one or two-side irradiation, the commercially available Hercules Merigraph Type 35 exposure unit (not shown) has been found to be suitable. Such a unit includes a rigid, light transmittive table for supporting the vessel 10 and a first group of eight tubular, UV lamps arranged thereabove with the longitudinal axes of the lamps parallel one to another and in a manner such that these axes define a plane parallel to the table. The lower surfaces of the lamp tubes are preferably spaced approximately three inches above the top surface of the cavity 35 defined within the vessel 10. Toshiba type 207FRL205 BL/M-A lamps have been found satisfactory for the purpose. The unit also includes an identical bank of lamps disposed about 3-4 inches below the table and parallel thereto. When forming an exemplary diaphragm plate having a thickness of about 0.055 inches, the upper bank of lamps is energized for about 3 seconds to irradiate the first unmasked upper surface, thereby solidifying it to a depth equal to the desired thickness of the diaphragm. In the example, an irradiation time of 3 seconds resulted in a diaphragm or relief thickness of about 0.005 inches. Following, the second bank of lamps is energized to irradiate the second, partially masked lower surface for the time required to solidify the remaining unmasked quantity of the first compound. It is to be appreciated that the volume of fluid confined between the relief thickness and the mask having the negative thereon will remain fluid during the aforementioned irradiation. The vessel is then disassembled and the unsolidified fluid is washed from the plate using a slightly alkali soap solution. It will be noted that those surfaces of the resulting diaphragm plate which have been in contact with the bottom and top masks 61, 60 or plates 11, 15, as the case may be, will be slightly tacky to the touch. This is believed to arise from the presence of oxygen molecules in air which results in some inhibition of surface curing. If the plate is to be used merely as a component of an otherwise conventional fluidic device, this tacky material may be eliminated by a 5 to 10 minute postcure exposure to UV light in accordance with the following procedure. The plate is submerged in a small amount of a solution prepared by dissolving 165 grams of Post EX-1 powder in one gallon water. Post EX-1, commercially available from Hercules Inc., is essentially potassium persulfate. The container with the photopolymer plate and the potassium persulfate solution is placed into the Merigraph exposure unit drawer, located about 3 inches below the lower bank of ultraviolet lamps, where the 5 minute to 10 minute post cure is accomplished. After the post cure irradiation from the lower bank of UV lamps, the plate is rinsed in water. When the aforementioned second photopolymer compound is used for the fabrication of a plate having greater rigidity, the post cure is accomplished in air by placing the plate on the table of the exposure unit and simultaneously irradiating the plate using both the upper and lower banks of UV lamps for from 5 minutes to 10 minutes. On the other hand, if the plate is to be used to form a free standing fluidic device comprised entirely of plates made of photopolymers, the tacky material should be retained for enhanced bonding characteristics. It should be appreciated that the foregoing is merely by way of example and not of limitation and diaphragm plates having diaphragms of thicknesses up to about 0.025 inches have been found useful in smaller pneumatic devices.

Figure 12:
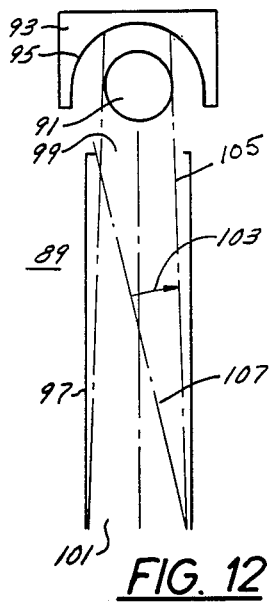
FIG. 12 is a cross-sectional side elevation view of a source of collimated ultraviolet light.

If it is desired to fabricate diaphragm plates or interface plates using one or more masks having plural opacities as shown in FIG. 10, one may use a collimated light source 89 to irradiate only one side of the photopolymer to be cured. As used in this specification, collimated light is defined to be light having rays maintained within about 3-4 degrees of parallelism. A suitable source 89 of collimated UV light is shown in FIG. 12 to include a source 91 of light such as a mercury lamp which has a peak output of about 365 nm wavelength. An irradiator 93 is centrally positioned above the source 91 in a spaced apart relation thereto and includes an interior, generally hemispherical, highly polished reflector surface 95. The source 89 also includes a generally square collimating tube 97 centrally disposed below the lamp 91 and the irradiator 93 in a spaced apart relation. The tube 97 includes an entry end having an aperture 99 therethrough of a diameter selected as described below. The interior of the tube 97 is coated to be dead black and has an exit end 101 to be spaced slightly above the surface to be irradiated. The length of the tube 97 and the diameter of the aperture 99 are preferably selected in view of the maximum width W of the surface to be irradiated. That is, the selection of those dimensional parameters should preferably be made so the maximum included angle 103 between a light ray 105 from the edge of the lamp 91 to the edge of the end 101 and a reflected light ray 107 from the edge of the aperture 99 to the outer extremity of the surface be no more than about 1.6 degrees. When a collimated source 89 of the type described above is used for single sided exposure, it will permit close dimensional control of those portions of the plates which lie vertically beneath or above the mask such as mask 71.

Figure 7A:
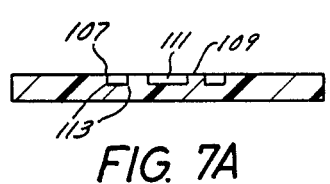
FIG. 7A is a cross sectional elevation view of a plate formed by the use of the mask of FIG. 7.

If it is desired to fabricate a diaphragm plate wherein the diaphragm has a diameter several times greater than the thickness of the parent, supporting plate, it has been found useful to fabricate the diaphragm as a compound structure, i.e., in a manner to have a central reinforced area. Accordingly, and referring to FIG. 7, a mask as shown in that FIGURE will be interposed between the bottom plate 11 and the spacer plate 13 while a clear top mask will be used between the spacer plate 13 and the top plate 15. Irradiation, vessel disassembly and washing in the two-sided manner described above will result in a partially completed diaphragm plate, the cross section of which is shown in FIG. 7A. That is, it will have an outer, annular diaphragm area 107 and an annular, upward projecting shoulder 109 defining a pocket 111 therewithin. The pocket 111 is preferably filled with the second compound to the level of the top rim of the shoulder 109 and the second compound is thereupon irradiated with UV light until solidified. With respect to either diaphragm formed as described above, the slightly diffuse nature of the light emanating from the exposure unit and the characteristics of the compounds themselves will result in a diaphragm plate, either simple or compound, having slightly rounded corners 113 which are resistive to tearing during diaphragm flexure.

To fabricate an exemplary interface plate, reference is made to FIGS. 1, 8 and 9. The mask 65 of FIG. 8 is interposed between the bottom plate 11 and the spacer plate 13 while the mask 67 of FIG. 9 is interposed between the spacer plate 13 and the top plate 15. It will be noted that the mask 65 includes a plurality of configurations having opaque areas 115 resembling the letter "Q" in shape and other opaque areas comprising circular dots 117. It will also be noted that the mask 67 of FIG. 9 includes a plurality of circular dots 117 sized and located to be in registry with those dots 117 of mask 65. When irradiated in the manner described above, and washed, the resulting interface plate will have a plurality of upwardly projecting control nozzles, eight in the example, surrounded by grooves resembling trepan grooves which connect to passages through which pneumatic fluid may flow. The quantity of compound confined between the dots 117 appearing on the masks 65 and 67 will remain liquid throughout the irradiation steps and when washed from the plate, will result in smooth sided, generally cylindrical shaped orifices through the plate. When fabricating an exemplary interface plate to have control nozzles, it is preferable to use the second compound for increased rigidity and washing removal of the uncured portions of this compound may be accomplished with ethyl alcohol. After understanding the teaching of the specification, it will be appreciated that vessel 45 may be used in a manner similar to that of vessel 10. While the latter may better lend itself to experimental or prototype work, the former may better lend itself to situations requiring more rapid production rates.

The technique used for bonding a plurality of plates to form a free standing fluidic control device will next be described. With respect to each plate to be bonded, a 250 mesh screen may be overlaid thereon, the screen to have masking conforming to those surface areas of the plate where it is desired to omit the application of the bonding resin. The plate is supported to contact the under surface of the screen and a small amount of bonding resin is bladed or squeegeed across the screen in a manner such that it is caused to pass through the screen at the unmasked area and deposit as small spots of liquid resin upon the surface to be bonded. When the screen is removed and the plate permitted to stand for a short time, the resin will flow to a homogeneous coating only a few microns in thickness. It is to be noted that of two plate surfaces to be bonded to one another, only one of those surfaces need have bonding resin applied thereto.

Subsequent to coating plate surfaces to be bonded, the plates are stacked upon a doweled bonding fixture constructed of a pair of relatively thick quartz or glass clamping plates for confining the stacked assembly therebetween. The plates are clamped one to another with spring loaded screws which are tightened to the degree necessary to extrude air from between the surfaces to be bonded. The quartz or glass selected is to be transparent to UV light and sufficiently thick to withstand clamping force. A plate thickness of approximately three-eighths inch has been found to be suitable for devices having surface dimensions of approximately two inches square. The stacked assembly is then irradiated with UV light for a period of about 10 minutes or until the bonding resin has solidified. The resulting device will be virtually homogeneous across the bonded sections and will be suitable for use as a free-standing fluidic control device, requiring only the attachment of control connections and perhaps a simple support bracket. The aforedescribed second compound has been found to be a suitable bonding resin or, more preferably, resin formula No. 5534 as available from Northwest Chemical Company may be used. The latter has a lower viscosity than the second compound and therefore will flow more readily through the screen.

Figure 13:
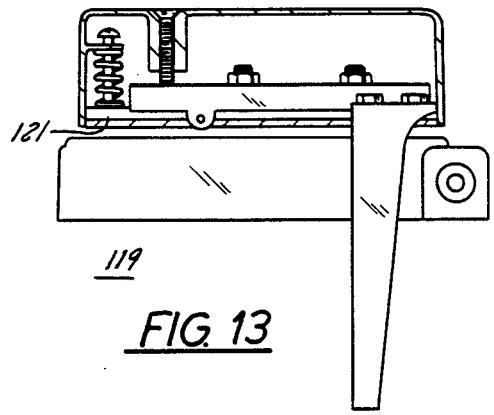
FIG. 13 is a simplified cross-sectional side elevation view of a pneumatic pilot positioner having incorporated therewithin a diaphragm plate made in accordance with the invention.
Figure 14:
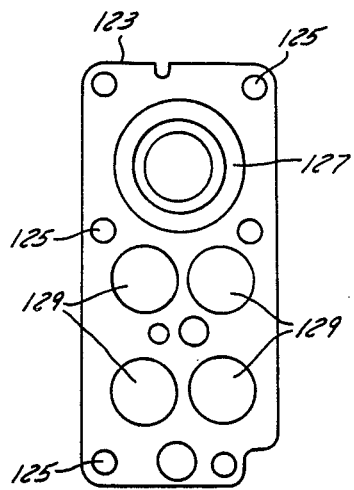
FIG. 14 is a top plan view of the diaphragm plate useful in the apparatus of FIG. 13.

FIG. 13 is a simplified cross-sectional view of a commercially available pneumatic pilot positioner 119, Model D9502 as manufactured by Johnson Controls, Inc. of Milwaukee, Wis. It has been found that the rubber coated fabric diaphragm 121 used therein may be replaced by the diaphragm plate 123 shown in FIG. 14. This diaphragm plate 123 has a plurality of holes 125 for receiving conventional assembly screws and further includes a plurality of diaphragms of either the compound type, diaphragm 127, or of the simple type, diaphragms 129, made according to the inventive method. It has been found that such a diaphragm plate formed of a photopolymer is of high quality, inexpensive to fabricate and readily able to withstand the rigors of pneumatic service within the positioner 119.

While only a few preferred methods have been shown and described herein, the invention is not intended to be limited thereby but only by the scope of the claims which follow.

We claim:

1. A method for forming a perimeter-supportable diaphragm plate having a movable diaphragm and useful as a component of a pneumatic control device, the method including the steps of:
   providing a vessel containing a quantity of a light-transmittive first photopolymer compound for forming a diaphragm plate, said first compound including, as mixed constituents, a reactive oligomer resin, a reactive monomer diluent and a photoinitiator;
   irradiating a first unmasked surface of said compound with ultraviolet light for solidifying said first surface to a depth equal to the desired thickness of a diaphragm, said ultraviolet light having a wavelength in the range of 300–400 nm;
   irradiating a second surface of said compound with said ultraviolet light, said second surface being partially covered by an opaque mask defining the shape of said diaphragm, said irradiating of said second surface thereby forming said diaphragm plate by solidifying the unmasked quantity of said compound, and;
   removing the unsolidified compound from the masked area of said plate.

2. The invention set forth in claim 1 wherein said first surface is solidified to a depth not in excess of 0.025 of an inch, thereby establishing the thickness of said diaphragm.

3. The invention set forth in claim 2 wherein said ultraviolet light has a wavelength in the range of 350–380 nm.

4. A method for forming a perimeter-supportable diaphragm plate having a movable diaphragm and useful as a component of a pneumatic control device, the method including the steps of:
   providing a vessel containing a quantity of a light-transmittive first photopolymer compound for forming the diaphragm portion of a diaphragm plate, said first compound including, as mixed constituents, a reactive oligomer resin, a reactive monomer diluent and a photoinitiator, said quantity of said first compound having a first depth equal to the desired thickness of said diaphragm portion;
   solidifying said first compound by irradiation with ultraviolet light;
   providing a quantity of a second, light-transmittive photopolymer compound, said quantity being cast atop said first compound to a second depth, said first depth and said second depth, combined, being equal to the desired thickness of said diaphragm plate, and;
   irradiating a surface of said second compound with ultraviolet light, said surface being partially covered by an opaque mask defining a diaphragm shape, said irradiation of said second compound thereby forming said diaphragm plate by solidifying the unmasked quantity of said second compound.

5. The invention set forth in claim 4 wherein said vessel includes a bottom plate, a top plate and a spacer plate separable from said bottom and top plates, said first compound being received in a vessel including a first spacer plate having a thickness equal to said first depth, said second compound being received in said vessel including a second spacer plate substituted for said first spacer plate, said second spacer plate having a thickness equal to said desired thickness of said diaphragm plate.

6. The invention set forth in claim 4 wherein said vessel includes a bottom plate, a top plate and at least one spacer plate disposed intermediate said bottom and top plates, said first compound being received in a vessel including a first spacer plate having a thickness equal to said first depth, said second compound being received in said vessel which further includes a second spacer plate disposed intermediate said first plate and said second plate, the combined thicknesses of said first and second spacer plates being equal to the desired thickness of said diaphragm plate.

7. The invention set forth in claim 5 wherein said second solidified compound has a hardness greater than the hardness of said first solidified compound.

8. The invention set forth in claim 6 wherein said second solidified compound has a hardness greater than the hardness of said first solidified compound.

9. A method for forming a perimeter-supportable diaphragm plate having a rigid center, movable diaphragm and useful as a component of a pneumatic control device, the method including the steps of:
   providing a vessel containing a quantity of a light-transmittive first photopolymer compound for forming a diaphragm plate, said first compound including, as mixed constituents, a reactive oligomer resin, a reactive monomer diluent and a photoinitiator;
   irradiating a first unmasked surface of said compound with ultraviolet light for solidifying said first surface to a depth equal to the desired thickness of a diaphragm, said ultraviolet light having a wavelength in the range of 300–400 nm;
   irradiating a second surface of said compound with said ultraviolet light, said second surface being partially covered by an opaque mask having a circular central mask area and an annular mask ring concentric to said central area and spaced apart therefrom to define an unmasked annulus therebetween for forming a diaphragm pocket;
   said irradiating of said second surface thereby solidifying the remaining, unmasked quantity of said first compound;
   removing the unsolidified first compound from the masked areas of said second surface;

filling said pocket with a light-transmittive second photopolymer compound, and;

irradiating said second compound with ultraviolet light until said second compound is solidified.

10. A method for fabricating a freestanding fluidic control device by irradiating light-sensitive polymer and including the steps of:

providing a vessel containing a quantity of a light-transmittive first photopolymer compound for forming a diaphragm plate;

irradiating a first unmasked surface of said first compound with ultraviolet light for solidifying said first surface to a depth equal to the desired thickness of a diaphragm;

irradiating a second surface of said first compound with ultraviolet light, said second surface being partially covered by an opaque mask defining a diaphragm shape, said irradiating of said second surface thereby forming said diaphragm plate by solidifying the remaining unmasked quantity of said first compound;

providing a plurality of vessels, each containing a quantity of a light-transmittive second photopolymer compound for forming an interface plate; each of said quantities having a first surface partially covered by an opaque mask defining at least one control channel;

irradiating each of said first surfaces with ultraviolet light solidifying the unmasked quantities of said second compound, thereby forming a plurality of interface plates;

removing unsolidified compound from the masked areas of said plates, and;

bonding said plates one to another to form a freestanding pneumatic control device.

11. The invention set forth in claim 10 wherein said first compound is a liquid having as mixed constituents a reactive oligomer resin, a reactive monomer diluent and a photoinitiator and wherein said first compound solidifies by crosslinking upon exposure to ultraviolet light and said second compound is a liquid having as mixed constituents a first constitutent of said first compound; a second constituent of a resin having a polyester base, at least two urethane groups, at least two methacrylate monomers and a photoinitiator; a third constituent including said oligomer resin in a percentage by volume lower than that of said first compound, further including said diluent in a percentage by volume higher than that of said first compound, further including said photoinitiator in a percentage by volume higher than that of said first compound; and a fourth constituent comprising a light-transmittive, pyrogenic silica.

12. The invention set forth in claim 11 wherein said bonding step includes the steps of:

removing unsolidified compound from the masked areas of said plates;

depositing a thin layer of a light sensitive polymer bonding agent upon one of each pair of plate surfaces to be bonded one to the other;

arranging said plates in a stack assembly to define said freestanding device;

clamping said assembly with a force sufficient to extrude gaseous fluid from between said plate surfaces to be bonded, and;

irradiating said assembly with ultraviolet light for solidifying said bonding agent.

13. A method for forming an interface plate having a movable diaphragm, a fluid flow channel and a fluid orifice, the method including the steps of:

providing a vessel containing a quantity of a light-transmittive first photopolymer compound including, as mixed constituents, a reactive oligomer resin, a reactive monomer diluent and a photoinitiator;

overlaying a first surface of said compound with a mask having a translucent area, a first area of a first opacity for defining said diaphragm, a second area of a second opacity for defining said channel and a third area of a third opacity for defining said orifice, and;

irradiating said first surface with ultraviolet light until that volume of said compound overlaid by said translucent area is solidified.

* * * * *